(12) United States Patent
Sumi

(10) Patent No.: US 7,669,717 B2
(45) Date of Patent: Mar. 2, 2010

(54) SUBSTRATE STORAGE CONTAINER AND POSITIONING METHOD OF THE SAME

(75) Inventor: Atsushi Sumi, Itoigawa (JP)

(73) Assignee: Shin-Etsu Polymer Co., Ltd., Chuo-Ku, Tokyo (JP)

( * ) Notice: Subject to any disclaimer, the term of this patent is extended or adjusted under 35 U.S.C. 154(b) by 420 days.

(21) Appl. No.: 11/578,696

(22) PCT Filed: Apr. 19, 2005

(86) PCT No.: PCT/JP2005/007434

§ 371 (c)(1),
(2), (4) Date: Oct. 17, 2006

(87) PCT Pub. No.: WO2005/112107

PCT Pub. Date: Nov. 24, 2005

(65) Prior Publication Data
US 2007/0215516 A1    Sep. 20, 2007

(30) Foreign Application Priority Data
May 17, 2004    (JP) .............................. 2004-146726

(51) Int. Cl.
*B65D 85/00* (2006.01)
*A47G 19/08* (2006.01)
(52) U.S. Cl. ..................... 206/710; 206/711; 211/41.18
(58) Field of Classification Search ................. 206/710, 206/711, 454, 832; 211/41.18; 438/106; 414/217.1, 217, 940
See application file for complete search history.

(56) References Cited

U.S. PATENT DOCUMENTS 4,842,686 A * 6/1989 Davis et al. ................. 438/709
6,006,919 A * 12/1999 Betsuyaku ................... 206/711
6,105,782 A * 8/2000 Fujimori et al. ............. 206/710
6,382,419 B1 * 5/2002 Fujimori et al. ............. 206/454

(Continued)

FOREIGN PATENT DOCUMENTS

EP    1 339 097 A    8/2003

(Continued)

OTHER PUBLICATIONS

European Search Report issued in corresponding Application No. EP 05 73 4662 dated Mar. 31, 2009.

*Primary Examiner*—Ehud Gartenberg
*Assistant Examiner*—Dene Quest
(74) *Attorney, Agent, or Firm*—Buchanan Ingersoll & Rooney PC

(57) ABSTRACT

A container body 1 for accommodating a multiple number of precision substrates in alignment, a door element for opening and closing the open front of container body 1 and a multiple number of positioning parts 40 arranged on the bottom of container body 1 are provided. Each positioning part 40 is formed as a concave portion with a pair of parallel ribs 2 formed on the bottom surface of container body 1 and inner surfaces 9 of curved portions 8 of a track 6 formed in a bottom plate 4. Inner surfaces 9 of track 6 are formed to be inclined linearly becoming gradually wider downwards from their top while the upper ends of inner surfaces 9 are extended to an opposing area 2a located between the lower ends of paired parallel ribs 2.

9 Claims, 8 Drawing Sheets

U.S. PATENT DOCUMENTS

| | | | |
|---|---|---|---|
| 6,622,883 B1 * | 9/2003 | Wu et al. | 220/323 |
| 7,383,955 B2 * | 6/2008 | Matsutori et al. | 206/711 |
| 2002/0020650 A1 | 2/2002 | Fujimori et al. | |
| 2002/0038733 A1 | 4/2002 | Fujimori et al. | |
| 2003/0188990 A1 * | 10/2003 | Bhatt et al. | 206/710 |

FOREIGN PATENT DOCUMENTS

| | | |
|---|---|---|
| JP | 2-146744 A | 6/1990 |
| JP | 11-168136 A | 6/1999 |
| JP | 2000-58633 A | 2/2000 |
| JP | 2000-306988 A | 11/2000 |
| JP | 2002-353299 A | 12/2002 |
| JP | 2003-174081 A | 6/2003 |

* cited by examiner

SUBSTRATE STORAGE CONTAINER AND POSITIONING METHOD OF THE SAME

TECHNICAL FIELD

The present invention relates to a substrate storage container for use in storage, shipment, transportation, preservation of substrates such as semiconductor wafers etc., as well as relating to a positioning method of the same.

BACKGROUND ART

In recent years, development of semiconductor parts into increasingly fine structures and the development of interconnections into smaller pitches have proceeded. In view of this, a substrate storage container, having a high sealability that provides prevention against contamination of the precision substrates, such as semiconductor wafers, held therein, and having a capability of being handled automatically, is demanded. In order to deal with such industry needs, there have been substrate storage containers whose door element for opening and closing the container body is automatically attached to, and removed from, the container body (see patent documents 1 and 2).

A substrate storage container of this type includes: for example, as shown in FIGS. 10 to 12, a container body 1 for accommodating a multiple number of unillustrated precision substrates; a multiple number of positioning parts 40A arranged at the bottom of this container body 1; a door element 20 for opening and closing the open front of container body 1; and a locking mechanism for locking and unlocking door element 20 fitted to the front of container body 1, and can be positioned and mounted on unillustrated processing equipment by means of the multiple positioning parts 40A.

Container body 1 has a robotic flange that is held by an automatic transporter called an OHT, attached on the top thereof, and is hoisted and conveyed with the robotic flange being held thereby. Multiple positioning parts 40A are arranged at the bottom of container body 1 in a predetermined pattern. Each positioning part 40A is composed of a pair of parallel ribs 2 formed on the bottom surface of container body 1 and a hollow track 6A formed in a bottom plate 4 covering the bottom surface of container body 1 and fitted around the paired parallel ribs 2 from below.

The locking mechanism, though not illustrated, is incorporated in the door element and locked or unlocked by an actuation key of a door element opening/closing device as a part of the processing equipment. The processing equipment has a multiple number of positioning pins 50 that will fit into positioning elements 40A, set (see FIG. 12) on the mounting surface on which a substrate storage container is mounted, and also has a sensor for detecting the presence of a substrate storage container.

Patent Document 1:
  Japanese Patent Application Laid-open 2000-58633

Patent document 2:
  Japanese Patent Application Laid-open 2003-174081.

DISCLOSURE OF INVENTION

Problems to be Solved by the Invention

Since the conventional substrate storage container is constructed as described above it has its center of gravity off the center of container body 1 to the front side because it has the heavy locking mechanism incorporated in the door element, hence the front side tends to be inclined downwards. This phenomenon occurs more frequently when a lower number of precision substrates are stored than when the maximum number substrates are fully stored therein. If the substrate storage container is positioned and mounted to the processing equipment while its front side remains inclined downwards the substrate storage container is unlikely to slide due to frictional resistance arising when positioning pins 50 of the processing equipment come into contact with positioning parts 40A, hence becomes stuck midway resulting in the serious problem that the container cannot be positioned with high precision.

Further since the substrate storage container is hoisted at its robotic flange, it cannot be said that it is easy to support the substrate storage container in a stable condition. Hence there is a fear that positioning parts 40A of container body 1 cannot be put into uniform contact with and fitted to respective positioning pins 50 of the processing equipment. As a result, there occurs the problem that the substrate storage container stops in a displaced and inclined position on the processing equipment, or causes sensor detection failures, resulting in an interruption of later operation.

The present invention has been devised in view of the above, it is therefore an object of the present invention to provide a substrate storage container which, even when the substrate storage container is mounted on a machine with the container body's door element side inclined downward, can be suitably positioned without causing any hindrance to later operation, as well as providing a positioning method of the same.

Means for Solving the Problems

In order to solve the above problem, a substrate storage container of the present invention comprises: a container body for accommodating substrates; a door element for opening and closing the open front of the container body; and a plurality of positioning parts provided on the bottom of the container body, and is characterized in that each positioning part includes a plurality of long pieces disposed apart from, and opposing, each other, and a plurality of short pieces located at least at lower positions between the ends of the multiple long pieces, and among the plurality of long and short pieces, at least the inner surfaces of the individual short pieces are formed to be inclined gradually becoming wider from the bottom portion of the container body downwards while the upper part of the interior surfaces are extended to the area between the plural long pieces.

Here, the bottom of the container body may be constructed of the bottom surface of the container body and a plate attached to the bottom surface of the container body; plural pairs of parallel ribs may be provided on the bottom surface of container body, each pair of ribs disposed apart from, and opposing, each other, so as to serve as the plural long pieces of the positioning part; and a plurality of hollow tracks enclosing individual pairs of parallel ribs arranged with the curved portions of each track may be made to serve as the plural short pieces of the positioning part.

Further, a locking mechanism incorporated in the door element for locking the door element that covers the front of the container body may be provided and the locking mechanism can be constructed of: a rotational body which is supported on the door element and rotated by external actuation; a plurality of advancing/retractable pieces which move inwards and outwards of the door element in accordance with the rotation of the rotational body; and engaging parts provided for individual advancing/retractable pieces, caused to project from, and retracted into, the periphery of the door element and be inserted into concave portions in the inner periphery at the front of the container body, in accordance with the advancing and retracting movement of the advancing/retractable pieces.

Moreover, the plate of the container body may be formed using at least one kind of thermoplastic resin selected from a group of polycarbonate, polybutylene terephthalate, polyether etherketone, polyether imide, polyether sulfone, polyacetal and liquid crystal polymer, which contain, at least, one kind of additive selected from a group of carbon fibers, glass fibers, carbon powder, fullerene, carbon nanotube, synthetic fibers, metallic fibers, fluoro resin, silicone, talc and mica.

Furthermore, each positioning part may be constructed so that the plural long pieces are divided into parts with respect to the longitudinal direction and may include a sectioning block which becomes thinner from the bottom of the container body downwards.

Also the sectioning block of each positioning part may be formed in a hollow conical shape.

Additionally, in order to solve the above problem, the present invention is a substrate storage container which is mounted on a plurality of positioning pins of processing equipment by means of a plurality of positioning parts, and is characterized in that in each positioning part a pair of inner sides opposing each other are formed each in the lengthwise direction and in the widthwise direction, and when the positioning parts are fitted onto the plural positioning pins of the processing equipment, at least, three inner sides of the four inner sides of each positioning part are brought into contact with the positioning pin.

Here, the paired inner sides opposing each other in the lengthwise direction of each positioning part may be formed by the inner surfaces of a paired of parallel ribs.

Still more, in order to solve the above problem, the present invention is a positioning method of a substrate storage container which is mounted on a plurality of positioning pins of processing equipment by means of a plurality of positioning parts and is characterized in that in each positioning part a pair of inner sides opposing each other are formed each in the lengthwise direction and in the widthwise direction, and when the positioning parts are fitted onto the plural positioning pins of the processing equipment, at least, three inner sides of the four inner sides of each positioning part are brought into contact with the positioning pin.

Here, the substrate defined in the scope of the claims may be various kinds of precision substrates. Specific examples include semiconductor wafers having a diameter of 300 mm, 400 mm and 450 mm, glass masks, liquid crystal glass, storage disks and the like. The container body may be either a front open box called FOUP, or a front open box called FOSB. The container body may be either, transparent, translucent or opaque and can be formed with a see-through window at the backside wall, side wall, ceiling or the like, as appropriate. The door element may be constructed of either a single plate or a plurality of plates and may be either transparent, translucent or opaque.

The door element is provided with a locking mechanism. This locking mechanism may be constructed of a rotational body which is supported on the door element and rotated by an actuation outside the door element, a plurality of advancing/retractable bars which are slidably supported by the door element and coupled rotatably to the rotational body and move in and out along the direction from the interior to the exterior of the door element in accordance with the rotation of the rotational body, and engaging rollers which are supported rotatably near the holes in the periphery of the door element and coupled rotatably to the distal ends of the individual advancing/retractable bars, and come in and out from the holes in the periphery of the door element in accordance with the advancing/retracting movement of the advancing/retractable bars.

Alternatively, the locking mechanism maybe constructed of a rotational body which is supported on the door element and rotated by an actuation outside the door element, a plurality of advancing/retractable shafts which are slidably supported on the door element by means of bearings and coupled rotatably in a direct or indirect manner with the rotational body and move in and out along the direction from the interior to the exterior of the door element in accordance with the rotation of the rotational body, and rollers which are supported rotatably on the advancing/retractable shafts and come in and out from the holes in the periphery of the door element in accordance with the advancing/retracting movement of the advancing/retractable shafts. When the rotational body and advancing/retractable shafts are coupled in an indirect manner, it is possible to couple the rotational body with advancing/retractable shafts, by use of crank engagement or the like.

Under conditions so as to prevent generation of dust and dirt, it is also possible to construct the locking mechanism of a gear which is supported on the door element and rotated by an actuation outside the door element, a plurality of advancing/retractable bars which are slidably supported by the door element and coupled to the gear by way of a second gear and move in and out along the direction from the interior to the exterior of the door element in accordance with the rotation of the gear, and engaging claws which are formed at the distal ends of the individual advancing/retractable bars and come in and out from the holes in the periphery of the door element in accordance with the advancing/retracting movement of the advancing/retractable bars, whereby it is possible to rotatably support the ends of advancing/retractable bars on a position off the center of the second gear.

The bottom of the container body is mainly constituted by the bottom surface of the container body and the plate attached to the bottom surface of the container body, but may be formed of either the bottom surface of the container body alone, or a plate attached to the container body alone. The plate may be either greater or smaller than the bottom surface of the container body, and its shape may be modified into a rectangle, polygon, approximately U-shape, Y-shape, etc.

The multiple long pieces constituting each positioning part may be opposing walls of a block having an approximately M-shaped section, or may be opposing long walls of a block having an approximately rectangular shape, viewed in plan. These multiple long pieces may or may not be formed so as to be inclined becoming wider as they go downwards from the bottom of the container body.

Other than the above, each positioning part may be constructed of a pair of parallel ribs provided on the bottom surface of the container body and a hollow track provided in the bottom surface of the container body and enclosing the paired parallel ribs while the track's curved portions may be positioned from below between the paired parallel ribs. Alternatively, each positioning part may be constructed of a pair of parallel ribs provided on a plate and a hollow track provided in the plate and enclosing the paired parallel ribs while the track's curved portions may be extended from below between the paired parallel ribs.

Concerning the hollow track, it is formed in an approximately oval shape, when viewed in plan, and is composed of an annular peripheral wall enclosing the paired parallel ribs and inclined surfaces formed in the inner surface of the peripheral wall, forming a hollow at the center of the area enclosed by the peripheral wall. In this case, a pair of parallel ribs is divided into front and rear paired parallel ribs, and these front and rear paired parallel ribs are enclosed by respective tracks while a sectioning block is interposed between the paired tracks. Further, the sectioning block is preferably formed in a conical shape, approximately ellipsoid or frustoconical shape.

Effects of the Invention

The present invention provides an effect that it is possible to suitably position a substrate storage container even when the substrate storage container is mounted on a machine with the container body's door element side inclined downward. Further, it is possible to effectively prevent occurrence of hindrance to the operation after positioning.

DESCRIPTION OF REFERENCE NUMERALS

Figure 1:
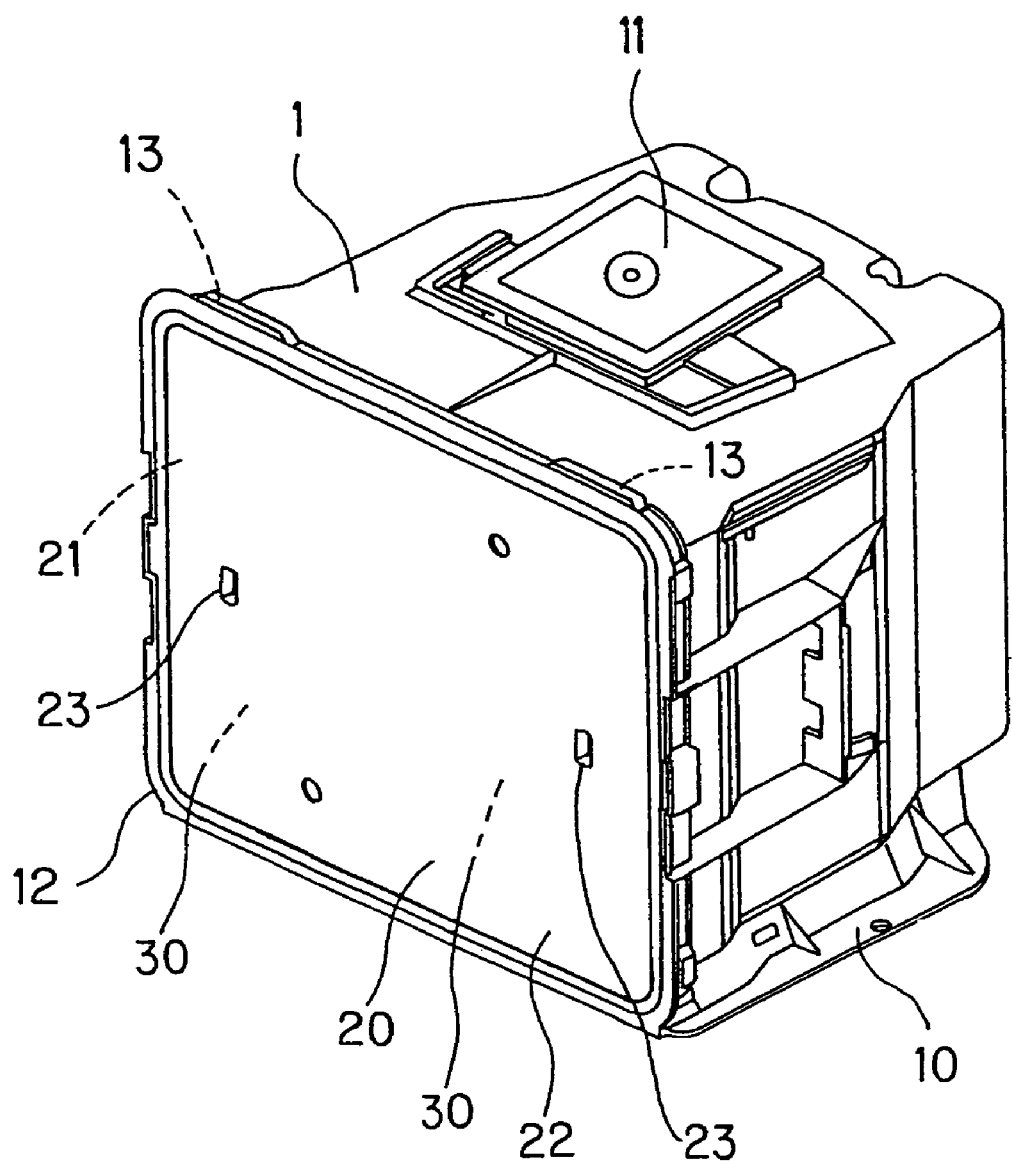
FIG. 1 is schematic overall perspective view showing an embodiment of a substrate storage container according to the present invention.

| 1 | container body |
| --- | --- |
| 2 | paired parallel ribs (long pieces, inner surfaces) |
| 2A | front, paired parallel ribs |
| 2a | opposing area |
| 2B | rear, paired parallel ribs |
| 3 | reinforcing rib |
| 4 | bottom plate (plate) |
| 6 | track |
| 7 | linear portion |
| 8 | curved part (short piece) |

-continued

| 9 | inner surface |
| --- | --- |
| 12 | rim portion (open front) |
| 13 | engagement hole (concave portion) |
| 20 | door element |
| 21 | fitting plate |
| 22 | cover plate |
| 23 | actuation passage-hole |
| 30 | locking mechanism |
| 40 | positioning part |
| 41 | sectioning block |
| 42 | outer peripheral surface |
| 50 | positioning pin |

BEST MODE FOR CARRYING OUT THE INVENTION

Referring to the drawings, a preferred embodiment of the present invention will be described hereinbelow. A substrate storage container of the present embodiment is also called a thin-plate accommodation/preservation container or shipment container. As shown in FIGS. 1 to 4, the substrate storage container is comprised of a container body 1 for accommodating a plurality (e.g., 25 or 26 pieces) of precision substrates such as, for instance, 12-inch semiconductor wafers, a door element 20 removably fitted to open and close the open front of the container body 1, a pair of left and right locking mechanisms 30 for locking and unlocking door element 20 that fits and encloses the front of container body 1, by external operation from a door element opening and closing device of processing equipment, and a plurality of positioning parts 40 arranged in the bottom of container body 1.

As shown in FIG. 1, container body 1 is formed of a predetermined resin into a transparent front-open box type in which both side walls are partially inclined inwards at their rear part so that the area of the backside wall is smaller than the area of the laterally long front, and provides the functions of accommodating a multiple number of thin, round precision substrates (not shown) in alignment, from top to bottom.

Though not illustrated, on both sides in the interior of container body 1 are provided integrally or removably with a pair of supporting plates of an approximately widely open-V-shape or approximately semicircular shape when viewed in plan. On the opposing surfaces of these paired left and right supporting plates, teeth of an approximately widely open-V-shape or approximately semicircular-arc shape when viewed in plan, are formed integrally in parallel to each other and arranged vertically with a predetermined pitch, so that a pair of left and right teeth support one precision substrate approximately horizontally.

Though not illustrated, each tooth is comprised of a flat plate formed in an approximately widely open-V-shape or an approximately semi-circular arc shape when viewed in plan, so as to go along the periphery of the precision substrate, a front medium-thick area formed in the curved front and interior part of the flat plate, a flat front thick area formed on the front outer side of the flat plate and outside the front medium-thick area, or in other words, located close to the supporting plate, a rear medium-thick area formed in the rear part of the flat plate, and a rear thick area formed on the rear outer part of the flat plate and in front of the rear medium-thick area and located close to the supporting plate. A step that will come into contact with the precision substrate is formed between the front medium-thick area and the front thick area, so that the precision substrate is supported approximately horizontally between flat front medium-thick areas and rear medium-thick areas.

Figure 2:
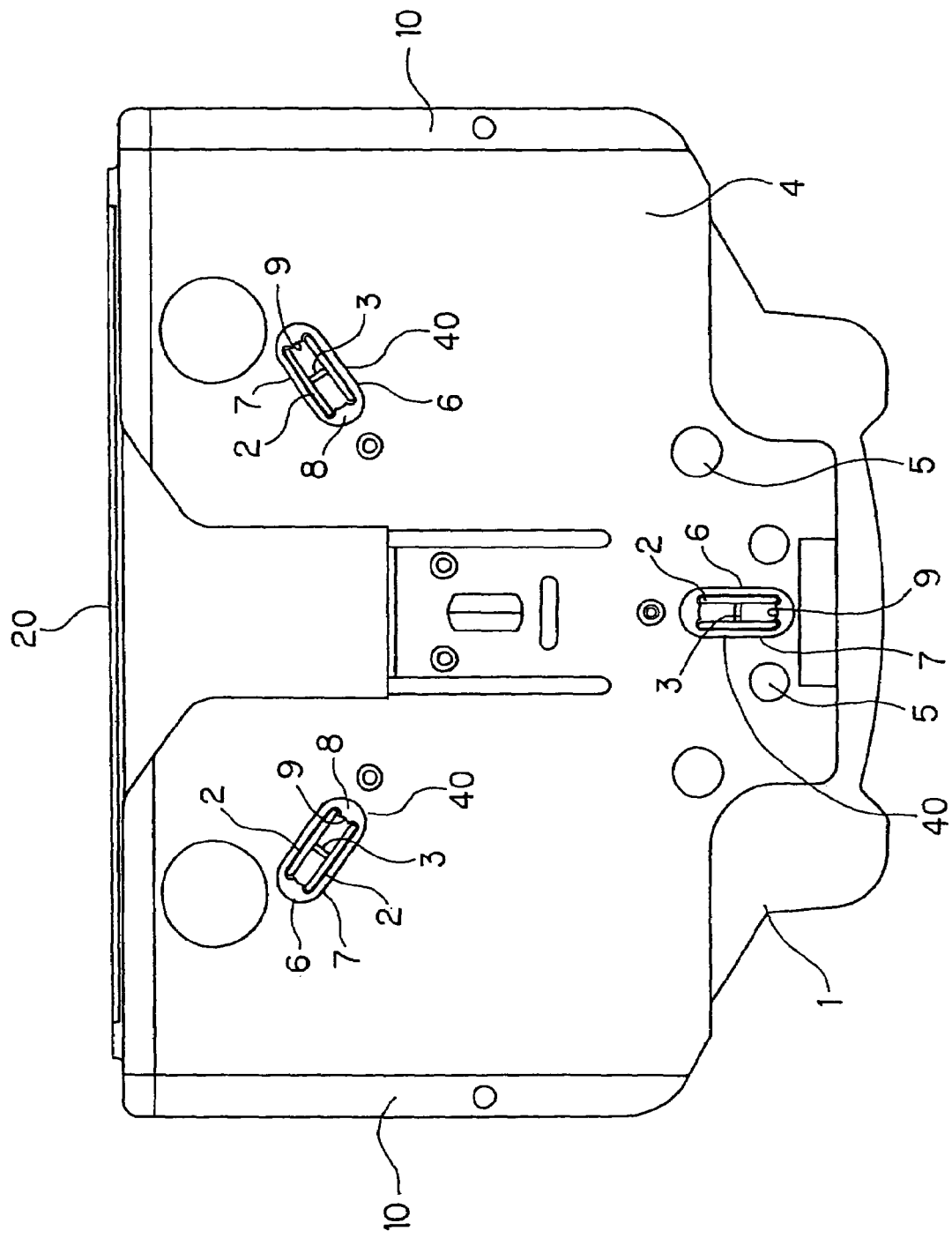
FIG. 2 is a bottom view showing an embodiment of a substrate storage container and its positioning method according to the present invention.

As shown in FIG. 2, a pair of parallel ribs 2 opposing each other are arranged at each of the front sides and the rear center on the bottom surface of container body 1 while a bottom plate 4 made of a thin plate is removably attached to the bottom surface of container body 1. A multiple number of detachable identifiers 5 are fitted in the rear part of this bottom plate 4 and detected by processing equipment so that the substrate storage container type, the number of precision substrates, etc. can be known.

Figure 3:
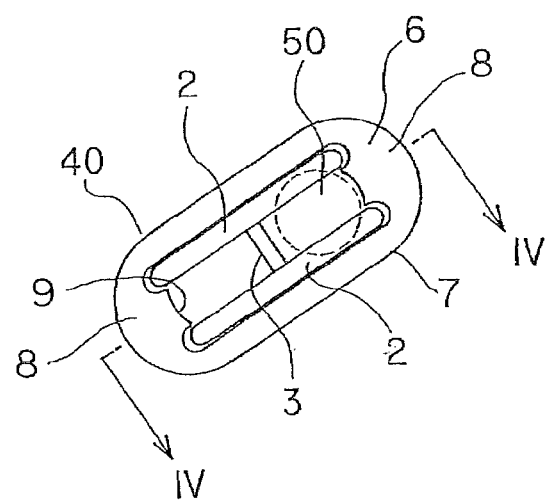
FIG. 3 is a bottom view showing a positioning part in an embodiment of a substrate storage container and its positioning method according to the present invention.

As shown in FIGS. 2 and 3, a bar-shaped reinforcement rib 3 is integrally bridged between paired parallel ribs 2 at their approximate center, so as to form an approximately H-shape, as a whole, when viewed from the bottom. Each of paired parallel ribs 2 is provided in a smooth linear plate-form without irregularity and is projected downward from the bottom surface of container body 1 (see FIG. 4).

Bottom plate 4 is formed in an approximately polygonal shape or the like, when viewed in plan, corresponding to the size of the bottom surface of container body 1, as shown in FIG. 2, and is bored with a plurality of (three in this embodiment) approximately oval-shaped passage holes laid out forming a substantially Y-shaped pattern when viewed from the bottom. Formed integrally with the periphery of each passage hole is a hollow track 6 that is fitted from below and encloses the lower part of paired parallel ribs 2.

Figure 4:
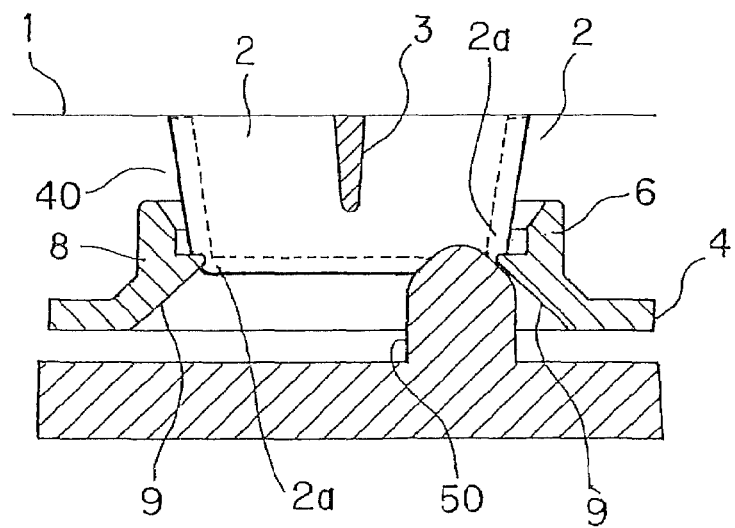
FIG. 4 is a sectional view cut along a line IV-IV in FIG. 3.

As shown in FIGS. 3 and 4, each track 6 is formed of a pair of linear parts 7 opposing, and apart from, each other, overlapping parallel ribs 2 from their outside and a pair of short, curved parts 8 integrally formed between the ends of the paired linear parts 7 and opposing each other, into an approximately oval shape when viewed from the bottom, and projected toward the bottom surface of container body 1 (upwards) from bottom plate 4.

Each curved part 8 is formed so that its outer peripheral surface is approximately semicircularly arced while a smooth inner surface 9 without irregularity is formed to be narrower than the distance between paired parallel ribs 2. This inner surface 9 is formed so as to be gradually inclined linearly becoming wider downwards from bottom plate 4 that is the bottom of container body 1 (see FIG. 4). This inner surface 9 is inclined from the opposing area 2a, located between the lower ends of paired parallel ribs 2 to the lower position between the ends of paired parallel ribs 2.

Processing equipment has three positioning pins 50, projected on the mounting surface on which a substrate storage container is placed, and arranged in an approximately Y-shaped pattern when viewed in plan so as to fit into multiple tracks 6, and has a sensor for detecting the presence of the substrate storage container. The distal end of each positioning pin 50 is formed with a curvature in an approximately elliptic spherical shape.

As shown in FIG. 1, on each side of the bottom surface of container body 1, a guide rail 10 having an approximately L-shaped cross section, extended from the front to the rear is jutted out, so that these a pair of left and right guide rails 10 can provide convenience during transportation of the substrate storage container. A robotic flange 11 having an approximately rectangular shape when viewed in plan, is integrally or removably attached at the center of the top of container body 1. This robotic flange 11 is lifted by an automatic transporter called an OHT so as to convey the substrate storage container between processing steps.

A rim portion 12 having an approximately fallen-L-shaped section is formed around the periphery of the open front of container body 1 so that it extends outwards. A multiple number of recesses are formed at top and bottom on the inner peripheral surface of this rim portion 12, as engagement holes 13 for locking the rectangular-shaped door element 20. Thick disk-shaped or fallen U-shaped carriage handles are optionally attached to both side walls of container body 1, so that the substrate storage container can be transported by holding these carriage handles.

Container body 1, supporting plates, teeth, bottom plate 4, guide rails 10, robotic flange 11 and carriage handles are formed of, for example, polycarbonate, polyether imide, polyether etherketone, cyclo-olefin resin or the like. A conductivity imparting agent etc. may be added as appropriate to these materials.

As shown in FIG. 1, door element 20 is composed of a fitting plate 21 having an approximately dish-like section, to be detachably fitted into rim portion 12 of container body 1 and a cover plate 22 that covers the opening front of fitting plate 21, and holds precision substrates by its elastic front retainer (not shown) in cooperation with a rear retainer (not shown) arranged on the interior rearside of container body 1.

Fitting plate 21 is formed in a laterally-long, approximately rectangular shape with its four corners rounded when viewed from the front, and has a peripheral wall having an approximately L-shaped or approximately H-shaped or approximately Z-shaped section for improved rigidity. An endless seal gasket fitted to this peripheral wall deforms and fits into rim portion 12 of container body 1 to assure sealing.

This seal gasket, though not illustrated, is formed of, for example, a hollow frame-shaped base, a tapering, flexed piece that is obliquely projected from the base, extending along the periphery on the outer side of the base and a single or a multiple number of fitting ribs which are projected from the base and forcibly fitted and compressed into a fitting holding groove formed on the peripheral wall of fitting plate 21, and provides a one-way sealing function which, when a pressure difference occurs between the exterior and interior of the substrate storage container sealed by door element 20, prevents air containing dust and dirt from flowing from the exterior into the interior of the substrate storage container, and permits air to flow out from the interior to the exterior of the substrate storage container.

A seal gasket of this kind may be formed of, for example silicone rubber, fluoro rubber, thermoplastic polyester elastomer, thermoplastic polyolefin elastomer etc., so as to be elastically deformable.

A multiple number of water drain holes to be used during washing are formed at predetermined intervals on the peripheral wall of fitting plate 21 while a pair of left and right holes are formed a predetermined distance apart at the top and bottom of the peripheral wall so that each hole opposes engagement hole 13 of container body 1 when door element 20 is fitted. A multiple number of holes for attachment of cover plate 22 are formed at predetermined intervals in the peripheral wall on both left and right sides of fitting plate 21.

As shown in FIG. 1, cover plate 22 is provided in a plate-like form, and a pair of actuation passage-holes 23 for locking mechanisms 30 of a rectangular shape when viewed from the front, are formed on both left and right sides around the center of the plate, an actuation key of the door opening and closing device of processing equipment being inserted into each actuation passage-hole 23.

Here, door element 20 may be formed of, for example, polycarbonate, fluorine-containing polycarbonate, polybutylene terephthalate, polyether etherketone, polyether imide, polyacetal or the like.

Though not detailed herein, each locking mechanism 30 includes: a rotary reel as a rotational body which is fitted and supported on a cylindrical rib inside fitting plate 21 and rotated by rotational actuation of an actuation key from without; a plurality of advancing/retractable bars which are slidably supported between cams of fitting plate 21 and cover plate 22 and linearly slide in and out of door element 20 in accordance with the rotation of the rotary reel; and engaging claws as engaging portions which are arranged at the distal ends of individual advancing/retractable bars, come in and out from the holes in the peripheral wall of the door element periphery to fit into and engage engagement holes 13 in rim portion 12, in accordance with the advancing and retracting movement of the advancing retractable bars.

Additionally, the coupling position and dimensions of the door element opening and closing device are specified for every container size by the SEMI standards. For example, the specifications of the device interface for automatically opening and closing door element 20 of a processing container for storing 12 inch (300 mm) semiconductor wafers in alignment, corresponds to the door element opening and closing device defined by SEMI standard E62.

Locking mechanism 30 is formed of, for example, polycarbonate, fluorine-containing polycarbonate, polybutylene terephthalate, polybutylene terephthalate, polyether etherketone, polyether imide, polyacetal or the like.

Each positioning part 40 is formed of, as shown in FIGS. 3 and 4, a concave portion constructed by a pair of parallel ribs 2 formed on the bottom surface of container body 1 and a pair of curved parts 8 in track 6 formed in bottom plate 4, parallel rib 2 being longer than curved part 8. The inner surfaces 9 of curved parts 8 in the widthwise direction of track 6 are formed to be inclined linearly becoming gradually wider from the top to bottom with the upper ends extended up to the opposing area 2a where the lower ends of paired parallel ribs 2 oppose each other.

In accordance with the above configuration, when the substrate storage container is positioned with respect to processing equipment with its heavier front side inclined downwards, positioning pin 50 comes into contact with, at least, three sides of the four sides, i.e., the inner surfaces of paired parallel ribs 2 and paired inner surfaces 9 of track 6, which constitute each positioning part 40. Accordingly, it is possible to correctly slide the substrate storage container into place without any wobble. Thus, it is possible to expect high precision positioning, and the substrate storage container will not slip out of place if the container is affected by some vibrations or the like.

Since it is also possible to bring positioning parts 40 into uniform contact with respective multiple number of positioning pins 50 of processing equipment, there will not occur any event such as the substrate storage container stopping on the processing equipment in a displaced and inclined position. Accordingly, there no longer occur any sensor detection failures due to stopping of the substrate storage container in a displaced and inclined position, hence it is possible to prevent interruption of later operation.

Further, the upper ends of track 6's smooth inner surfaces 9 without irregularity are extended up to the opposing area 2a where the lower ends of paired parallel ribs 2 oppose each other, so that the inner surfaces of paired parallel ribs 2 and inner surfaces 9 of track 6 become approximately continuous. As a result, wobbling of the substrate storage container is minimized when positioned and can be placed at a correct position without displacement.

As described above, when the substrate storage container having a multiple number of positioning parts 40 is positioned to the processing equipment having a multiple number of positioning pins 50, at least three side of the four sides of each positioning part 40 can be put into contact with positioning pin 50, hence it is possible to achieve positioning of the substrate storage container with high dimensional precision.

Figure 5:
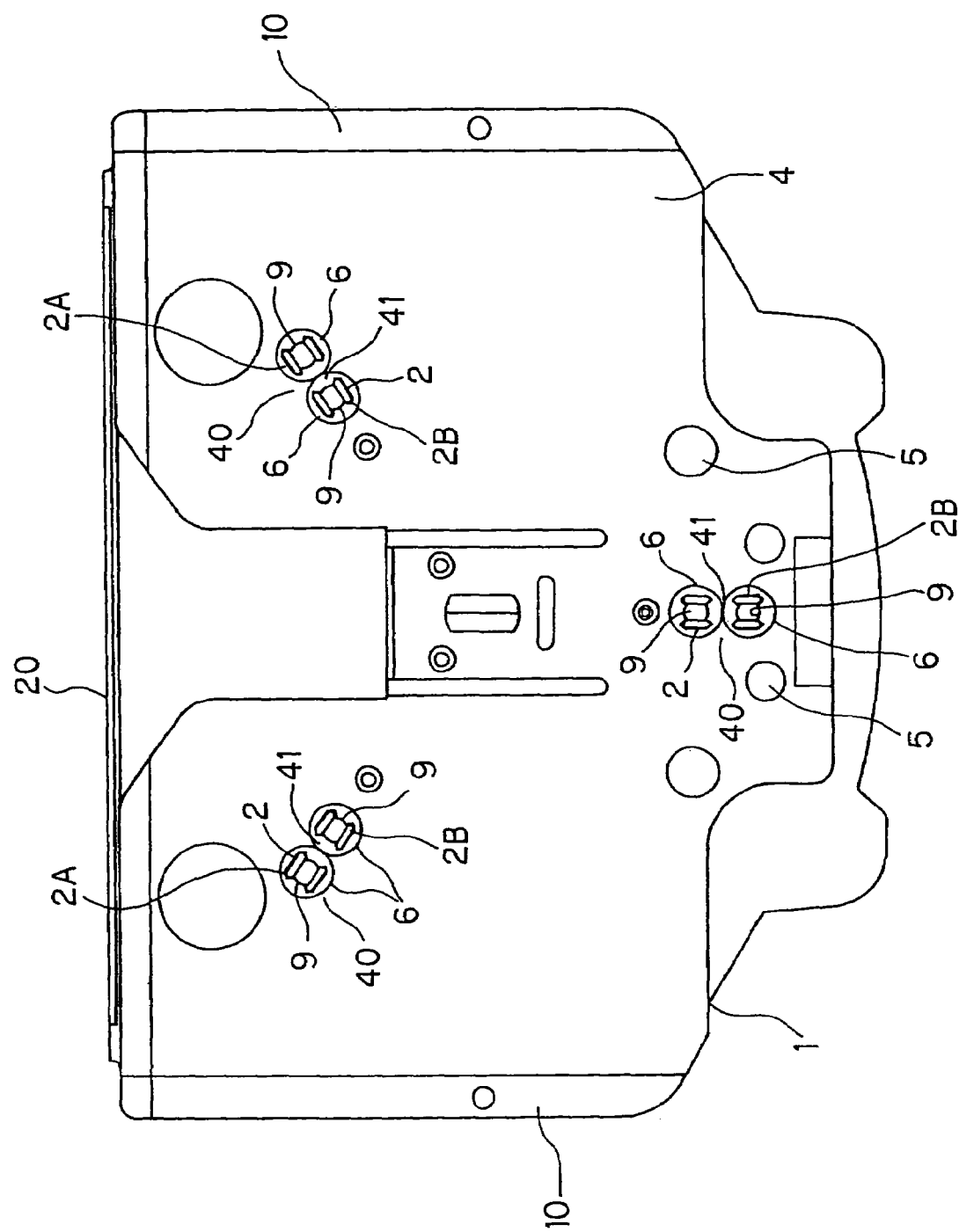
FIG. 5 is a bottom view showing the second embodiment of a substrate storage container and its positioning method according to the present invention.
Figure 6:
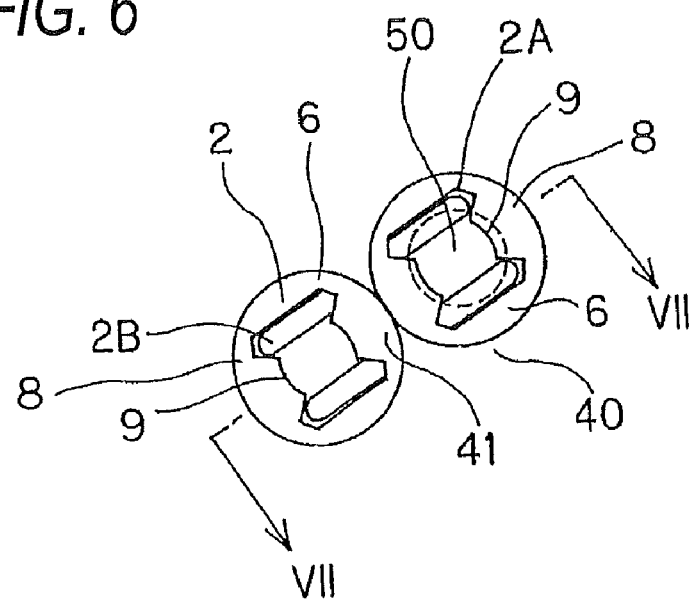
FIG. 6 is a bottom view showing a positioning part in the second embodiment of a substrate storage container and its positioning method according to the present invention.
Figure 7:
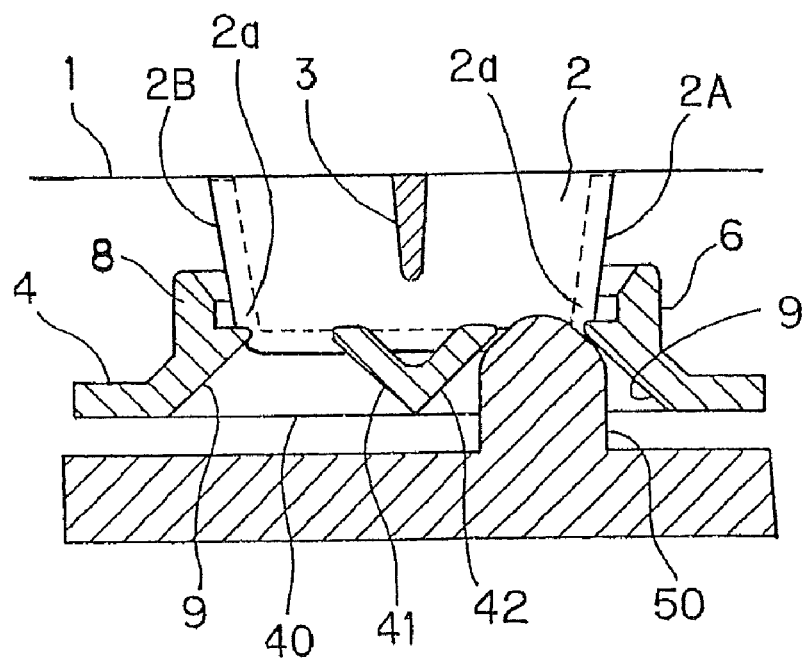
FIG. 7 is a sectional view cut along a line VII-VII in FIG. 6.

Next, FIGS. 5 to 7 show the second embodiment of the present invention. In this case, a pair of parallel ribs 2 is divided into front paired parallel ribs 2A and rear paired parallel ribs 2B, and these front paired parallel ribs 2A and rear paired parallel ribs 2B are enclosed by respective tracks 6 while a sectioning block 41 that separates the front paired parallel ribs 2A and the rear paired parallel ribs 2B into two parts in the front-to-rear longitudinal direction is interposed between a pair of tracks 6.

As shown in FIG. 7, sectioning block 41 is formed in a hollow conical shape that gradually tapers downwards from bottom plate 4 with its outer peripheral surface 42 formed smoothly without irregularity, whereby positioning pin 50 comes into sliding contact with this outer peripheral surface 42 to be guided into the predetermined position. Other components are the same as the above embodiment so the description is omitted.

Also in this embodiment, the same operation and effect as in the above embodiment can be expected. In addition, since sectioning block 41 that guides positioning pin 50 is located between front paired parallel ribs 2A and rear paired parallel ribs 2B and positioning pin 50 is put into contact with the four sides, i.e., the inner sides of one paired parallel ribs 2, inner surface 9 of track 6 and outer peripheral surface 42 of sectioning block 41, the range in which positioning pin 50 is wobbled can be made smaller. Accordingly, it is obvious that high-precision positioning can be expected and that it is possible to prevent the substrate storage container from being displaced from the correct position by vibrations and the like.

Though in the above embodiment, description was made on a front open box type container body 1 that opens in the horizontal direction only, the container body 1 may be placed upwards when door element 20 is removed or precision substrates are put in and taken out. It is also possible to provide a supporting frame instead of supporting plates. In this supporting frame a multiple number of teeth may be provided parallel to each other and arranged in the vertical direction on vertical ribs. Further, it is also possible to provide retaining grooves having an approximately fallen U-shaped or approximately fallen V-shaped section, disposed between adjacent teeth, in the rear of the supporting frame, so that the peripheral edges at both sides in the rear of the precision substrates can be supported by the retaining grooves.

Here, each tooth may be comprised of a flat plate formed in an approximately widely open-V-shape, when viewed in plan so as to go along the periphery of the precision substrate, a front medium-thick rib formed in the bent, front inner area on the flat plate, a front thick area formed on the front outer side of the flat plate and outside the front medium-thick rib, or in other words, located close to the supporting frame, a rear medium-thick area formed in the rear part of the flat plate, wherein a step is formed between the front medium-thick rib and the front thick area, so that the precision substrate is supported approximately horizontally between approximately flat, front medium-thick ribs and rear medium-thick areas.

Instead of the bottom surface of container body 1, a multiple number of positioning parts 40 maybe formed on bottom plate 4. Further, bottom plate 4 may be extended so as to form raised opposing walls on both sides thereof, which oppose the side walls of container body 1 and carriage handles for holding may be attached to the opposing walls. Also, a raised wall that is located on the backside of container body 1 may be provided in the rear of bottom plate 4 so that ID codes, IC tags etc., may be applied to, fitted to, supported by, this wall.

Also, when the peripheral part of the open front of container body 1 may be formed so as to have an approximately fallen L-shaped section and its distal end portion may be formed so as to have an approximately U-shaped section, it is possible to use these depressed interior spaces as engagement holes 13. Further, a first endless seal gasket is attached to the peripheral part on the rear side of fitting plate 21 while a second endless seal gasket is attached around the peripheral wall of fitting plate 21 so that the second seal gasket can be positioned on the outer side of the first seal gasket with respect to its width direction.

Further, concerning bottom plate 4 and positioning part 40, it is possible to form them using at least one kind of thermoplastic resin selected from a group of polycarbonate, polybutylene terephthalate, polyether etherketone, polyether imide, polyether sulfone, polyacetal and liquid crystal polymer, which contain, at least, one kind of additive selected from a group of carbon fibers, glass fibers, carbon powder, fullerene, carbon nanotube, synthetic fibers, metallic fibers, fluoro resin, silicone, talc and mica, in an appropriate amount. Moreover, positioning part 40 may be formed integrally with container body 1 or may be integrated by insert molding etc., after it has been formed of a material different from that of container body 1.

EMBODIMENT EXAMPLE

Next, embodiment examples of the substrate storage container according to the present invention and its positioning method will be described and compared with a comparative example.

Embodiment Example 1

Figure 8:
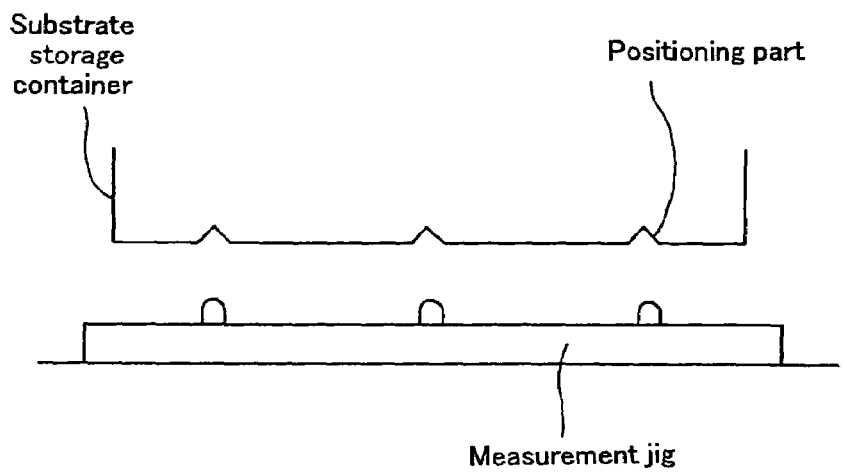
FIG. 8 is an illustrative view showing a measurement jig for bottom plates in an embodiment example of a substrate storage container and its positioning method according to the present invention.
Figure 9:
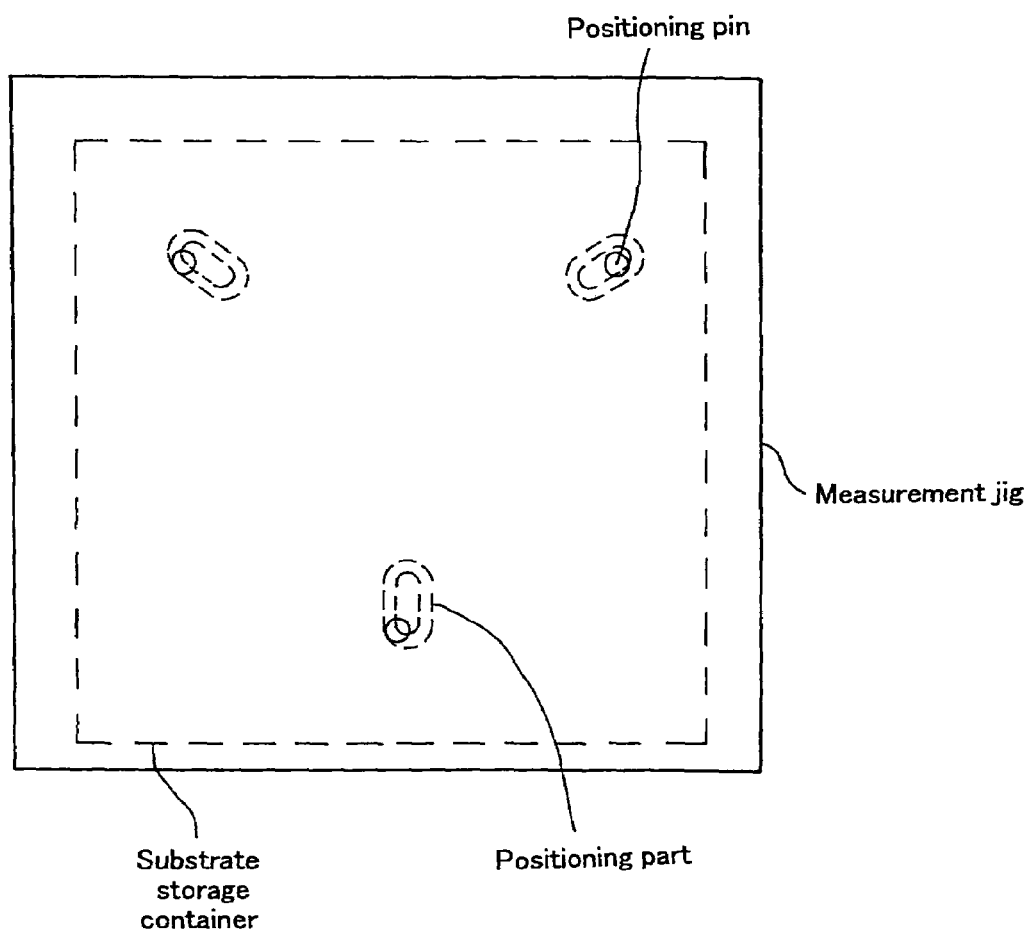
FIG. 9 is an illustrative view showing a state where a container body is placed on a measurement jig for bottom plates in an embodiment example of a substrate storage container and its positioning method according to the present invention.

First, as shown in FIG. 8, using a measurement jig for bottom plates, produced with the dimensions based on the SEMI standard, an empty substrate storage container provided with the positioning parts illustrated in the first embodiment was set on this measurement jig, and after the container was moved from the normal position to the position shown in FIG. 9, the container was released from the hand so as to check whether it would go back to the original position. Ten samples were tested, and the result is shown in Table 1.

Embodiment Example 2

An empty substrate storage container provided with the positioning parts illustrated in the second embodiment was set on the above measurement jig, and after the container was moved from the normal position to the position shown in FIG. 9, the container was released from the hand so as to check whether it would go back to the original position. Ten samples were tested, and the result is shown in Table 1.

Comparative Example

Figure 10:
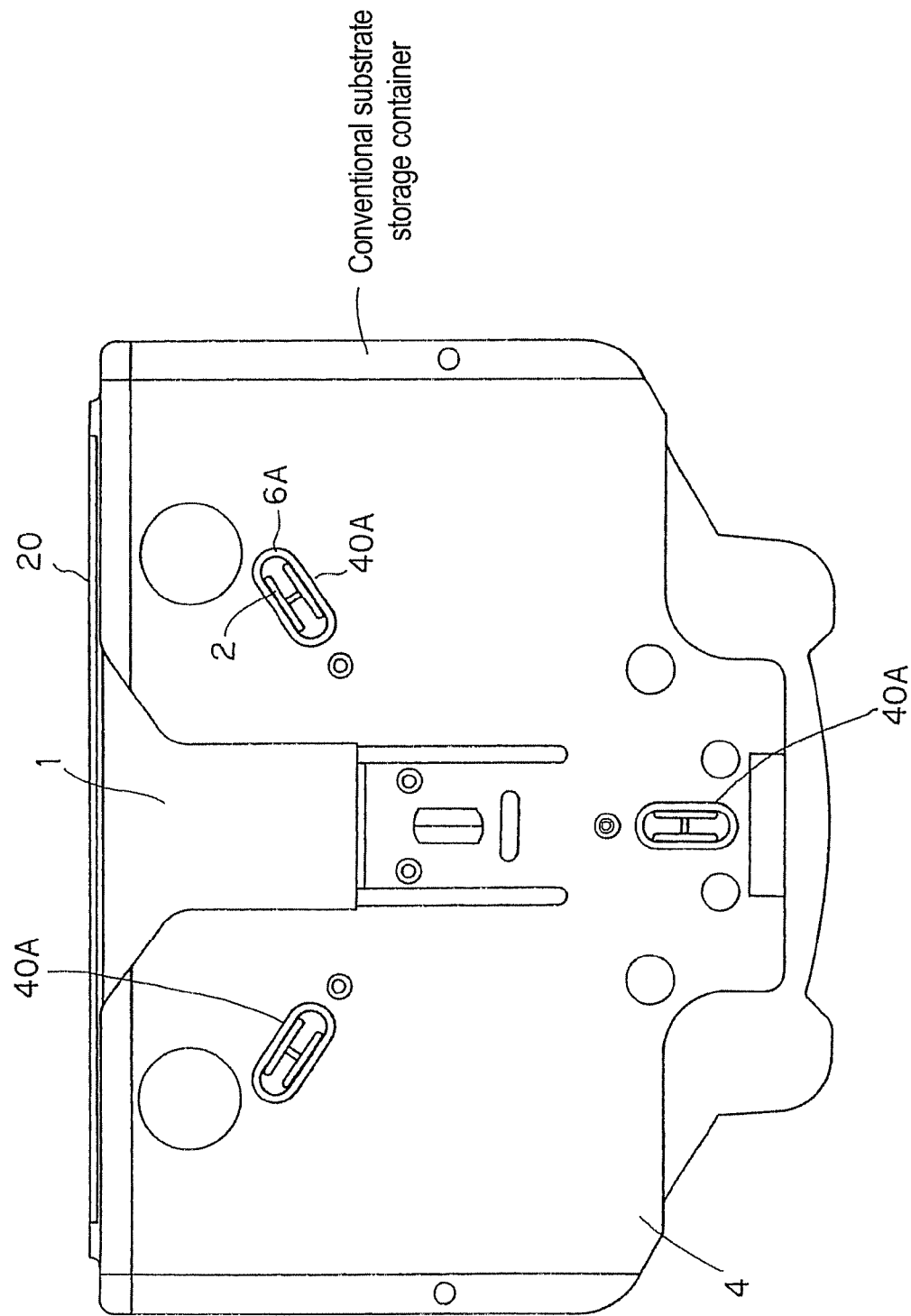
FIG. 10 is a bottom view showing a conventional substrate storage container.
Figure 11:
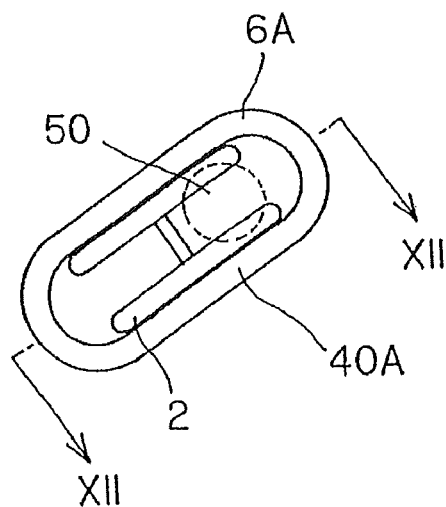
FIG. 11 is a bottom view showing a positioning part of a conventional substrate storage container.
Figure 12:
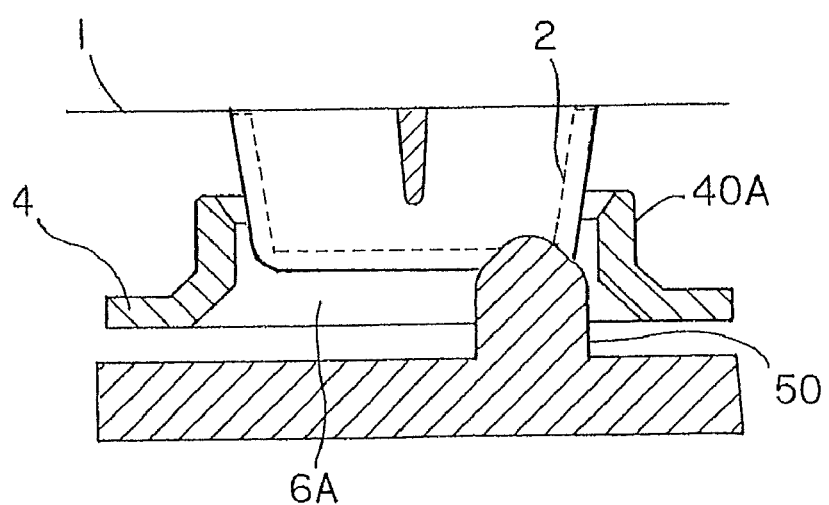
FIG. 12 is a sectional view cut along a line XII-XII in FIG. 11.

An empty substrate storage container provided with the conventional positioning parts shown from FIGS. 10 to 12 was set on the above measurement jig, and after the container was moved from the normal position to the position shown in FIG. 9, the container was released from the hand so as to check whether it would go back to the original position. Ten samples were tested, and the result is shown in Table 1.

TABLE 1

Test for checking whether the positioning parts went up on the positioning pin

| | Whether the positioning parts went up on the positioning pins |
|---|---|
| Embodiment example 1 | None (0/10) |
| Embodiment example 2 | None (0/10) |
| Comparative example | occurred (9/10) |

The invention claimed is:

1. A substrate storage container comprising: a container body for accommodating substrates; a door element for opening and closing an open front of the container body; and a plurality of positioning parts provided on a bottom of the container body, characterized in that each positioning part includes a plurality of long pieces disposed apart from, and opposing, each other, and a plurality of short pieces located at least at lower positions between the ends of the multiple long pieces, and among the plurality of long and short pieces, at least inner surfaces of the individual short pieces are formed to be inclined so that a space between the inner surfaces gradually becomes wider from the bottom portion of the container body downwards while the upper part of the inner surfaces are extended to the area between the plural long pieces.

2. The substrate storage container according to claim 1, wherein the bottom of the container body is constructed of a bottom surface of the container body and a plate attached to the bottom surface of the container body; plural pairs of parallel ribs are provided on the bottom surface of the container body, each pair of ribs disposed apart from, and opposing, each other, so as to serve as the plural long pieces of the positioning parts; and a plurality of oval tracks enclosing individual pairs of parallel ribs arranged with the curved portions of each track are made to serve as the plural short pieces of the positioning parts.

3. The substrate storage container according to claim 1, further comprising: a locking mechanism incorporated in the door element for locking the door element that covers the open front of the container body, wherein the locking mechanism includes: a rotational body which is supported on the door element and rotated by external actuation; a plurality of advancing/retractable pieces which move inwards and outwards of the door element in accordance with the rotation of the rotational body; and engaging parts provided for individual advancing/retractable pieces, caused to project from, and retracted into, an inner periphery of the door element and to be inserted into concave portions in the inner periphery at the open front of the container body, in accordance with the advancing and retracting movement of the advancing/retractable pieces.

4. The substrate storage container according to claim 2, wherein the plate is formed using at least one kind of thermoplastic resin selected from a group consisting of polycarbonate, polybutylene terephthalate, polyether etherketone, polyether imide, polyether sulfone, polyacetal and liquid crystal polymer, wherein the thermoplastic resin contains, at least, one kind of additive selected from a group consisting of carbon fibers, glass fibers, carbon powder, fullerene, carbon nanotube, synthetic fibers, metallic fibers, fluoro resin, silicone, talc and mica.

5. The substrate storage container according to claim 2, wherein each of the positioning parts is constructed so that the plural long pieces are divided into parts with respect to the longitudinal direction by a sectioning block which becomes thinner from the bottom of the container body downwards.

6. The substrate storage container according to claim 5, wherein the sectioning block of each of the positioning parts is formed in a hollow conical shape.

7. The substrate storage container according to claim 1, wherein the substrate container is mounted on a plurality of positioning pins of processing equipment by the plurality of positioning parts, characterized in that in each of the positioning parts a pair of the inner surfaces opposing each other are formed each in the lengthwise direction and in the widthwise direction, and when the positioning parts are fitted onto the plural positioning pins of the processing equipment, at least, three inner surfaces of the four inner surfaces of each of the positioning parts are brought into contact with each of the positioning pins.

8. The substrate storage container according to claim 7, wherein the pair of inner surfaces opposing each other in the lengthwise direction of each of the positioning parts are formed by the inner surfaces of a pair of the parallel ribs.

9. A positioning method of a substrate storage container according to claim 1, the method comprising mounting the substrate container on a plurality of positioning pins of processing equipment by the plurality of positioning parts, characterized in that in each of the positioning parts, a pair of the inner surfaces opposing each other are formed each in the lengthwise direction and in the widthwise direction, and when the positioning parts are fitted onto the plurality of positioning pins of the processing equipment, at least, three inner surfaces of the four inner surfaces of each of the positioning parts are brought into contact with each of the positioning pins.

* * * * *